United States Patent
Sakamoto et al.

(10) Patent No.: US 10,187,224 B2
(45) Date of Patent: Jan. 22, 2019

(54) RADIO RECEIVING APPARATUS

(71) Applicant: Panasonic Corporation, Osaka (JP)

(72) Inventors: Takenori Sakamoto, Kanagawa (JP); Yohei Morishita, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 15/895,823

(22) Filed: Feb. 13, 2018

(65) Prior Publication Data
US 2018/0270085 A1 Sep. 20, 2018

(30) Foreign Application Priority Data

Mar. 15, 2017 (JP) ................................. 2017-050100
Nov. 8, 2017 (JP) ................................. 2017-215531

(51) Int. Cl.
*H03M 5/14* (2006.01)
*H04L 25/02* (2006.01)
*H04L 25/03* (2006.01)

(52) U.S. Cl.
CPC .......... *H04L 25/022* (2013.01); *H03M 5/145* (2013.01); *H04L 25/0204* (2013.01); *H04L 25/03834* (2013.01); *H04L 25/03885* (2013.01)

(58) Field of Classification Search
USPC ........................................ 375/340, 319, 376
See application file for complete search history.

(56) References Cited

U.S. PATENT DOCUMENTS 8,447,000 B2 *  5/2013  Manickam ........ H04L 25/03254
                                                          375/285
9,841,446 B1 * 12/2017  Vaculik .................. G01R 23/02
2001/0053272 A1 * 12/2001 Takiguchi ........ G11B 20/10009
                                                          386/269
2006/0203949 A1 *  9/2006 Minemura ....... G11B 20/10009
                                                          375/376
2011/0103520 A1 *  5/2011 Molnar ............... H04L 27/0008
                                                          375/340
2015/0231987 A1 *  8/2015 Lin ........................ H03M 1/186
                                                          320/128
2015/0261407 A1 *  9/2015 Yoshitomi ............... H03L 7/197
                                                          345/157
2016/0380788 A1 * 12/2016 Waheed .................. H04B 1/30
                                                          375/319
2017/0222848 A1 *  8/2017 Sun ....................... H04L 7/0012

OTHER PUBLICATIONS

Kumer et al., "Proposal for IEEE802.15.3d—THz PHY," IEEE P802.15-16-0595-03-003d, Nov. 8, 2016, 32 pages.

* cited by examiner

*Primary Examiner* — Eva Y Puente

(74) *Attorney, Agent, or Firm* — Seed IP Law Group LLP

(57) ABSTRACT

A radio receiving apparatus includes an RF front-end unit that performs gain control and downconversion on a received signal, an analog equalizer that performs an analog equalization process on an output signal from the RF front-end unit in accordance with a coefficient of analog equalization, an analog/digital converter that samples and quantizes an output signal from the analog equalizer, a digital equalizer that performs a digital equalization process on an output signal from the analog/digital converter in accordance with a coefficient of digital equalization, and a coefficient-of-equalization calculator that calculates the coefficient of analog equalization and the coefficient of digital equalization by estimating frequency characteristics with use of the output signal from the analog/digital converter.

6 Claims, 8 Drawing Sheets

RADIO RECEIVING APPARATUS

BACKGROUND

1. Technical Field

The present disclosure relates to a radio receiving apparatus including an analog equalizer.

2. Description of the Related Art 15-16-0595-03-003d-proposal-for-ieee802-15-3d-thz-phy proposes a radio communication standard that involves the use of a bandwidth of several gigahertz to several tens of gigahertz per channel. The wider the bandwidth per channel becomes, the higher sampling rate an analog/digital converter is required to have. For the realization of the wideband radio communication disclosed in 15-16-0595-03-003d-proposal-for-ieee802-15-3d-thz-phy, a high sampling rate of several gigahertz to several tens of gigahertz is under consideration for an analog/digital converter.

Further, 15-16-0595-03-003d-proposal-for-ieee802-15-3d-thz-phy also proposes a plurality of modulation schemes such as BPSK, QPSK, 16QAM, and 64QAM. In order to handle multilevel modulation, an analog/digital converter is required to have high resolution.

Thus, the wideband radio communication requires an analog/digital converter to have both a high sampling rate and high resolution.

Further, radio communication requires the prevention of deterioration in receiving characteristic that is caused by an increase in error vector magnitude of a received signal under the influence of the frequency characteristics (e.g. in-band amplitude deviation) of an RF front end. For the prevention of deterioration in receiving characteristic, improvement of the resolution of an analog/digital converter is under consideration.

SUMMARY

However, since there is a trade-off between the sampling rate and resolution of an analog/digital converter, it is difficult to further increase the resolution of the analog/digital converter in the wideband radio communication, which requires a high sampling rate.

One non-limiting and exemplary embodiment provides a radio receiving apparatus that makes it possible to prevent deterioration in receiving characteristic without increasing the resolution of an analog/digital converter.

In one general aspect, the techniques disclosed here feature a radio receiving apparatus including: RF front-end circuitry that performs gain control and downconversion on a received signal; analog equalization circuitry that performs an analog equalization process on an output signal from the RF front-end circuitry in accordance with a coefficient of analog equalization; analog/digital conversion circuitry that samples and quantizes an output signal from the analog equalization circuitry; digital equalization circuitry that performs a digital equalization process on an output signal from the analog/digital conversion circuitry in accordance with a coefficient of digital equalization; and coefficient-of-equalization calculation circuitry that calculates the coefficient of analog equalization and the coefficient of digital equalization by estimating frequency characteristics with use of the output signal from the analog/digital conversion circuitry.

The general aspect of the present disclosure makes it possible to prevent deterioration in receiving characteristic without increasing the resolution of an analog/digital converter.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Embodiment 1

An embodiment of the present disclosure is described in detail below with reference to the drawings.

Frame Format

Figure 1:
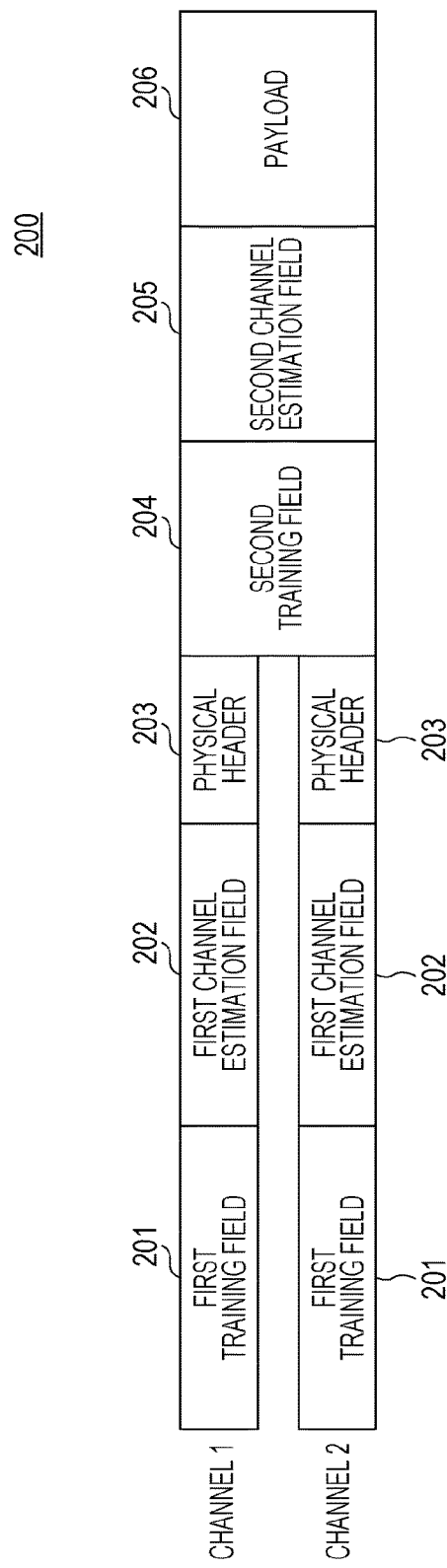
FIG. 1 is a diagram showing an example of a frame format according to Embodiment 1.

FIG. 1 is a diagram showing an example of a frame format 200 that is used for performing communication through two channels bundled by channel bonding. As shown in FIG. 1, a first training field 201, a first channel estimation field 202, and a physical header 203 are transmitted with a minimum unit of bandwidth BW1 (Hz) on Channel 1 and Channel 2 so that a radio receiving apparatus that is not compatible with channel bonding can receive the first training field 201, the first channel estimation field 202, and the physical header 203. Meanwhile, a second training field 204, a second channel estimation field 205, and a payload 206 are transmitted with a wide bandwidth BW2 (Hz) on one channel (hereinafter denoted as "Channel 3") set up by bundling Channel 1 and Channel 2. Note here that BW2=2×BW1 holds. The physical header 203 contains information on the bandwidths of the second training field 204 and subsequent fields and a modulation scheme that is used by the payload 206.

Further, the first training field 201, the first channel estimation field 202, the physical header 203, the second training field 204, and the second channel estimation field 205 are used for synchronization, gain adjustment, channel estimation, notification of control information, and the like. For this reason, these fields use a simple and robust modulation scheme such as BPSK so as to reach a communication partner with reduced errors. Meanwhile, the payload 206 uses a multilevel modulation scheme such as QPSK, 16QAM, or 64QAM so that more information reaches the communication partner with higher frequency efficiency.

Configuration of Radio Receiving Apparatus

Figure 2:
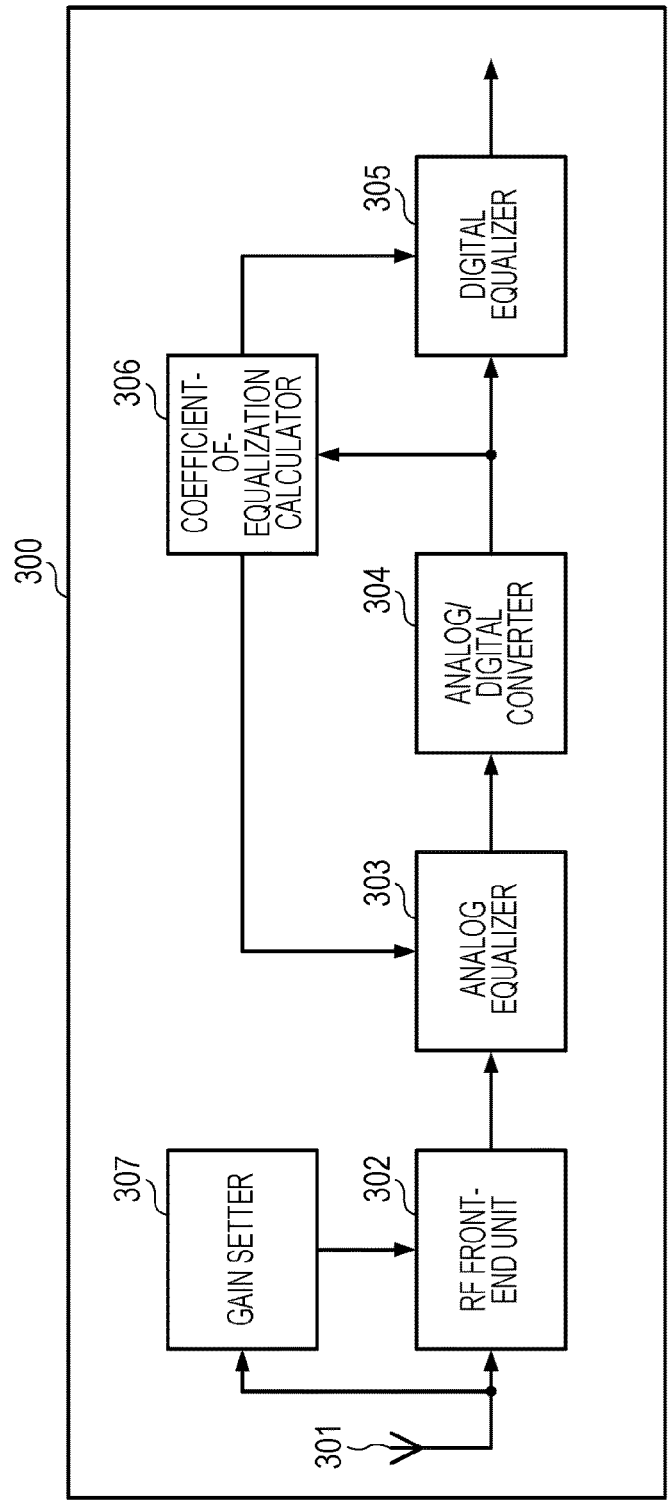
FIG. 2 is a diagram showing an example configuration of a radio receiving apparatus according to Embodiment 1.

FIG. 2 is a diagram showing an example configuration of a radio receiving apparatus 300 according to Embodiment 1. The radio receiving apparatus 300 includes a receiving antenna 301, an RF front-end unit (RF front-end circuitry) 302, an analog equalizer (analog equalization circuitry) 303, an analog/digital converter (analog/digital conversion circuitry) 304, a digital equalizer (digital equalization circuitry) 305, a coefficient-of-equalization calculator (coefficient-of-equalization calculation circuitry) 306, and a gain setter (gain setting circuitry) 307.

The RF front-end unit 302 amplifies, with use of a gain set by the gain setter 307, the amplitude of a radio-frequency received signal received via the receiving antenna 301. Furthermore, the RF front-end unit 302 performs downconversion on the received signal whose amplitude has been adjusted and outputs an analog baseband signal to the analog equalizer 303. It should be noted that an internal configuration of the RF front-end unit 302 will be described in detail later.

The analog equalizer 303 receives the analog baseband signal from the RF front-end unit 302 and performs an analog equalization process on the physical header 203 and subsequent signals of the analog baseband signal in accordance with a coefficient of analog equalization calculated by the coefficient-of-equalization calculator 306. The analog equalization process is a process of lowering error vector magnitude by correcting frequency characteristics. The analog equalizer 303 outputs the signals finished with the analog equalization process (i.e. the physical header 203 and subsequent signals subjected to the analog equalization process) to the analog/digital converter 304. It should be noted that the analog equalizer 303 omits to perform the analog equalization process on signals representing the first training field 201 and the first channel estimation field 202 and outputs the signals to the analog/digital converter 304 as signals unprocessed with analog equalization.

The analog/digital converter 304 receives the analog baseband signal from the analog equalizer 303, samples and quantizes the analog baseband signal (i.e. converts the analog baseband signal into a digital signal), and outputs the digital baseband signal to the digital equalizer 305 and the coefficient-of-equalization calculator 306.

The analog/digital converter 304 uses a sampling rate which is twice as high as that which is used in the absence of channel bonding.

The digital equalizer 305 performs a digital equalization process of correcting the residual frequency characteristics of the payload 206 in accordance with a coefficient of digital equalization calculated by the coefficient-of-equalization calculator 306.

The coefficient-of-equalization calculator 306 calculates the coefficient of analog equalization by estimating the frequency characteristics of the RF front-end unit 302 with use of the first channel estimation field 202 of the digital baseband signal outputted from the analog/digital converter 304.

Further, the coefficient-of-equalization calculator 306 calculates the coefficient of digital equalization by estimating the residual frequency characteristics with use of the second channel estimation field 205 of the digital baseband signal outputted from the analog/digital converter 304. It should be noted that an internal configuration of the coefficient-of-equalization calculator 306 will be described in detail later.

The gain setter 307 so calculates a gain on the basis of the received power and peak-to-average power ratio of the first training field 201 of the received signal received via the receiving antenna 301 that the amplitude of an input signal to the analog/digital converter 304 falls within a full-scale range. The term "full-scale range" refers to the maximum value of amplitude (or the minimum value of negative amplitude) that can be quantized by the analog/digital converter 304. The gain setter 307 outputs a gain control signal by which the gain of a variable gain amplifier (variable gain amplify circuitry) 302_1 (see FIG. 3) of the RF front-end unit 302 is set.

Further, the gain setter 307 calculates another gain on the basis of the received power and peak-to-average power ratio of the second training field 204 of the received signal received via the receiving antenna 301. Then, the gain setter 307 resets the gain of the variable gain amplifier 302_1 (see FIG. 3) of the RF front-end unit 302. The peak-to-average power ratios of the second training field 204, the second channel estimation field 205, and the payload 206, which are transmitted through one channel-bonded channel, are lower than the peak-to-average power ratios of the first training field 201, the first channel estimation field 202, and the physical header 203, which are transmitted through two channels. Therefore, carrying out a gain readjustment makes it possible to take full advantage of the resolution of the analog/digital converter 304.

Internal Configuration of RF Front-end Unit

Figure 3:
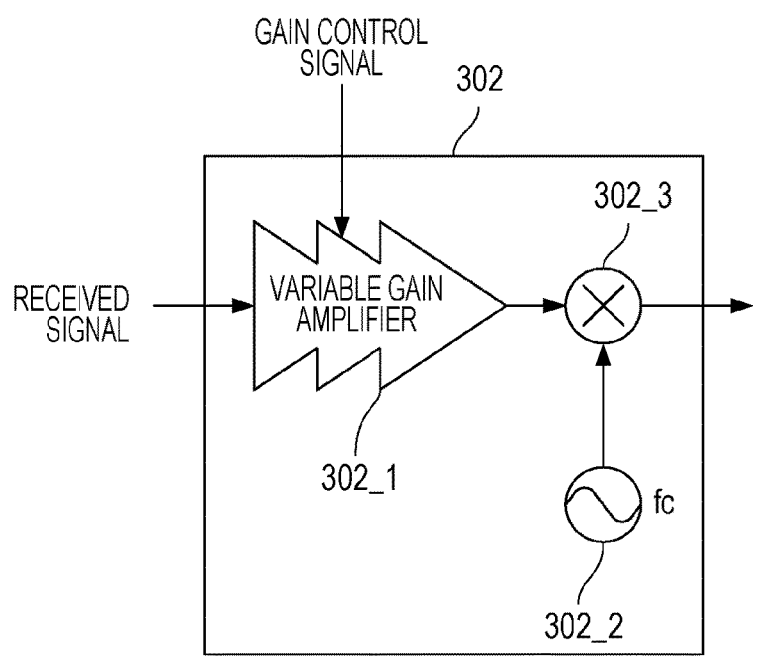
FIG. 3 is a diagram showing an example configuration of an RF front-end unit according to Embodiment 1.

Next, the internal configuration of the RF front-end unit 302 is described in detail with reference to FIG. 3. As shown in FIG. 3, the RF front-end unit 302 includes the variable gain amplifier 302_1, a local oscillator (local oscillation circuitry) 302_2, and a mixer (mixing circuitry) 302_3.

The variable gain amplifier 302_1 adjusts the amplitude of a radio-frequency received signal received via the receiving antenna 301. The gain of the variable gain amplifier 302_1 is set by the gain control signal that the gain setter 307 outputs.

The local oscillator 302_2 generates a sine wave of a frequency fc (Hz) and outputs it to the mixer 302_3. In Embodiment 1, which performs communication through Channel 3 set up by bundling two channels by channel bonding, fc=(f1+f2)/2 for example when the center frequency of Channel 1 shown in FIG. 1 is f1 (Hz) and the center frequency of Channel 2 is f2 (Hz).

The mixer 302_3 performs downconversion by multiplying, by the sine wave of the frequency fc (Hz), the received signal outputted from variable gain amplifier 302_1.

It should be noted that although the variable gain amplifier 302_1 is provided in front of the mixer 302_3 in the example shown in FIG. 3, a variable gain amplifier(s) may be provided either behind or both in front of and behind the mixer 302_3 in Embodiment 1.

Internal Configuration of Coefficient-of-equalization Calculator

Figure 4:
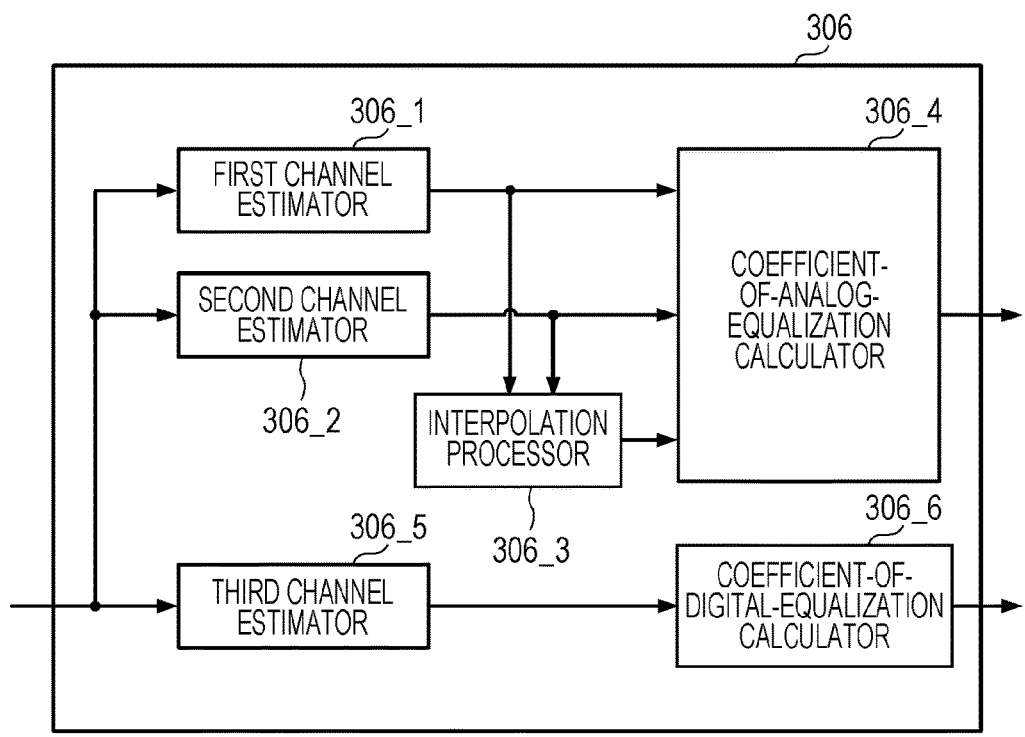
FIG. 4 is a diagram showing an example configuration of a coefficient-of-equalization calculator according to Embodiment 1.

Next, the internal configuration of the coefficient-of-equalization calculator 306 is described in detail with reference to FIG. 4. As shown in FIG. 4, the coefficient-of-equalization calculator 306 includes a first channel estimator (first channel estimation circuitry) 306_1, a second channel estimator (second channel estimation circuitry) 306_2, an interpolation processor (interpolation processing circuitry) 306_3, a coefficient-of-analog-equalization calculator (coefficient-of-analog-equalization calculation circuitry) 306_4, a third channel estimator (third channel estimation circuitry) 306_5, and a coefficient-of-digital-equalization calculator (coefficient-of-digital-equalization calculation circuitry) 306_6.

The first channel estimator 306_1 performs a rotation process of fc–f1 (Hz) on the digital baseband signal containing the first channel estimation field 202, extracts, from the digital baseband signal, the first channel estimation field 202 transmitted through Channel 1, performs a channel estimation of Channel 1 with use of the signal representing the first channel estimation field 202 thus extracted, and outputs a first channel estimation result to the interpolation processor 306_3 and the coefficient-of-analog-equalization calculator 306_4. The second channel estimator 306_2 performs a rotation process of fc–f2 (Hz) on the digital baseband signal containing the first channel estimation field 202, extracts, from the digital baseband signal, the first channel estimation field 202 transmitted through Channel 2, performs a channel estimation of Channel 2 with use of the signal representing the first channel estimation field 202 thus extracted, and outputs a second channel estimation result to the interpolation processor 306_3 and the coefficient-of-analog-equalization calculator 306_4.

Figure 5:
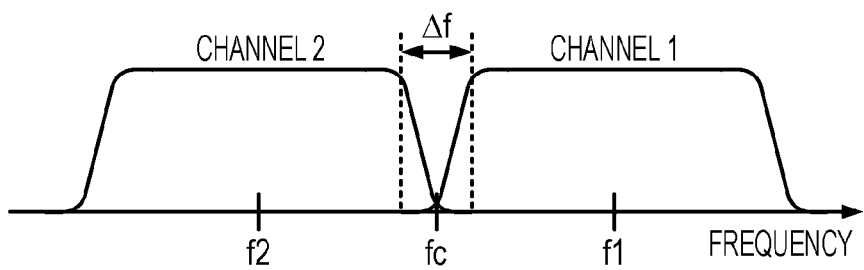
FIG. 5 is a diagram showing an example of a spectrum of a first training field, a first channel estimation field, and a physical header according to Embodiment 1.

As shown in FIG. 5, a spectrum of the first channel estimation field 202 has a gap band Δf between a spectrum of Channel 1 and a spectrum of Channel 2. The interpolation processor 306_3 performs a channel estimation of the gap band Δf through an extrapolation process on the first channel estimation result, an extrapolation process on the second channel estimation result, an interpolation process on the first channel estimation result and the second channel estimation result, or a similar process and outputs a channel estimation result of Δf to the coefficient-of-analog-equalization calculator 306_4.

The coefficient-of-analog-equalization calculator 306_4 calculates the coefficient of analog equalization for the full band (see Channel 3 shown in FIG. 6) of a combination of Channel 1 and Channel 2 with use of the first channel estimation result, the second channel estimation result, and the channel estimation result of Δf. Then, the coefficient-of-analog-equalization calculator 306_4 determines the resistance of a resistor, the inductance of an inductor, the capacitance of a capacitor, and the like of the analog equalizer 303 on the basis of the coefficient of equalization thus calculated.

Figure 6:
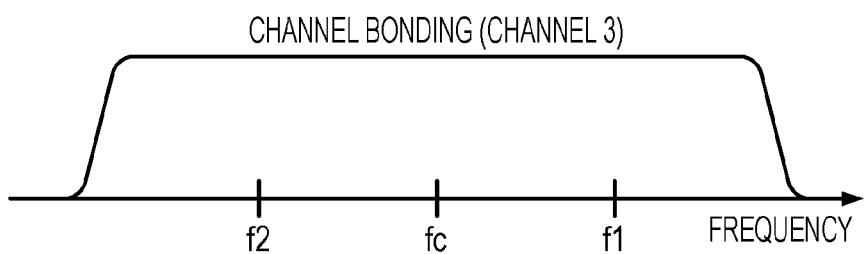
FIG. 6 is a diagram showing an example of a spectrum of a second training field, a second channel estimation field, and a payload according to Embodiment 1.

The third channel estimator 306_5 performs a channel estimation of Channel 3 with use of the second channel estimation field 205 and outputs a third channel estimation result to the coefficient-of-digital-equalization calculator 306_6. This allows third channel estimator 306_5 to estimate the residual frequency characteristics that were not fully corrected by the analog equalizer 303. The residual frequency characteristics tend to be greater in the gap band Δf shown in FIG. 5. As shown in FIG. 6, a spectrum of the second channel estimation field 205 has no gap band Δf unlike the spectrum of the first channel estimation field 202. Therefore, the third channel estimator 306_5 can perform a high-accuracy channel estimation on a band portion corresponding to the gap band Δf.

The coefficient-of-digital-equalization calculator 306_6 calculates the coefficient of digital equalization for the channel-bonded band BW2 (Hz) with use of the third channel estimation result.

Internal Configuration of Analog Equalizer

Figure 7:
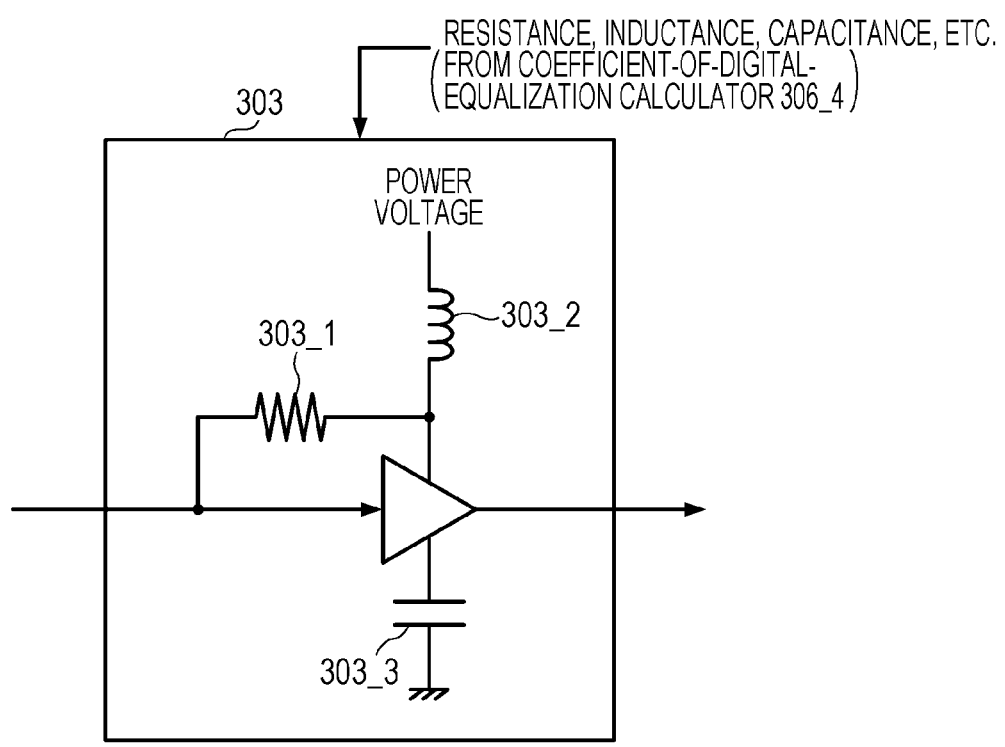
FIG. 7 is a diagram showing an example configuration of an analog equalizer according to Embodiment 1.

Next, the Internal Configuration of the Analog Equalizer 303 is Described in detail with reference to FIG. 7. As shown in FIG. 7, the analog equalizer 303 includes a resistor 303_1, an inductor 303_2, and a capacitor 303_3.

The analog equalizer 303 changes the frequency characteristics of the analog equalizer 303 by setting the resistance of the resistor 303_1, the inductance of the inductor 303_2, the capacitance of the capacitor 303_3, and the like in accordance with the coefficient of analog equalization determined by the coefficient-of-equalization calculator 306 (i.e. the coefficient-of-analog-equalization calculator 306_4). This makes it possible to lower the error vector magnitude by correcting the physical header 203, the second training field 204, the second channel estimation field 205, and the payload 206, which were distorted by the frequency characteristics of the RF front-end unit 302.

Receiving Operation Sequence

Next, a receiving operation in the radio receiving apparatus 300 for receiving a received signal of the frame format 200 is described with reference to FIG. 2.

First, the RF front-end unit 302 performs amplitude adjustment and downconversion on the radio-frequency received signal received via the receiving antenna 301 and outputs an analog baseband signal. It should be noted that the analog equalizer 303 does not start an equalization process until the coefficient-of-equalization calculator 306 calculates the coefficient of analog equalization.

Next, the analog/digital converter 304 samples and quantizes the analog baseband signal and outputs a digital baseband signal.

Next, the coefficient-of-equalization calculator 306 calculates the coefficient of analog equalization by estimating the frequency characteristics of the RF front-end unit 302 with use of the first channel estimation field 202.

After the coefficient-of-equalization calculator 306 has calculated the coefficient of analog equalization, the analog equalizer 303 performs an analog equalization process on the physical header 203 and subsequent signals with use of the coefficient of analog equalization to correct the waveforms of the physical header 203 and subsequent signals, which were distorted by the frequency characteristics of the RF front-end unit 302.

Next, the analog/digital converter 304 samples and quantizes the physical header 203 and subsequent signals in sequence.

Next, the coefficient-of-equalization calculator 306 calculates the coefficient of digital equalization by estimating the residual frequency characteristics of the payload 206 with use of the second channel estimation field 205.

Finally, the digital equalizer 305 performs a digital equalization process with use of the coefficient of digital equalization calculated by the coefficient-of-equalization calculator 306, thereby correcting the waveform of the payload 206, which was distorted by the residual frequency characteristics.

Relationship Between Analog Equalization Process and Resolution of Analog/Digital Converter Next, a relationship between an analog equalization process that is performed by the analog equalizer 303 and the resolution of the analog/digital converter 304 is described.

In the case of a conventional radio receiving apparatus where the amplitude of an input signal to an analog/digital converter exceeds a full-scale range, the analog/digital converter clips the amplitude of an output signal in the full-scale range. In a case where the output signal has been clipped, amplitude information gets lost. The conventional radio receiving apparatus has difficulty in restoring the lost amplitude information with a digital equalizer.

For this reason, the conventional radio receiving apparatus has used a method by which to adjust the gain of a variable gain amplifier of an RF front-end unit so that the amplitude of the received signal (i.e. the input signal to the analog/digital converter) falls within the full-scale range.

However, the conventional radio receiving apparatus has a risk that the amplitude of the input signal to the analog/digital converter may become higher than it is supposed to be due to an increase in the error vector magnitude of the received signal under the influence of the frequency characteristics of the RF front-end unit.

With this point taken into account, the conventional radio receiving apparatus adjust to lower the gain of the variable gain amplifier by setting a margin so that the amplitude of the received signal is lower than the full-scale range. Since lowering the gain is equivalent to a decrease in resolution, an example of a method for preventing deterioration in receiving characteristic is to improve the resolution of the analog/digital converter as much as the gain is lowered.

However, as mentioned above, it is difficult to further increase resolution in wideband radio communication.

On the other hand, in Embodiment 1, the analog equalizer 303 performs an analog equalization process to lower the error vector amplitude by correcting the frequency characteristics of the RF front-end unit 302. This makes it possible, even without setting a margin, to put the amplitude of the received signal within the full-scale range of the analog/digital converter 304.

It should be noted that although a signal unprocessed with analog equalization requires a margin, the first training field 201 and the first channel estimation field 202 use a simple modulation scheme such as BPSK as mentioned earlier; therefore, it is possible to contain a margin for a BPSK signal by designing the resolution of the analog/digital converter 304 on the assumption of the use of a multilevel modulation scheme by the payload 206.

This makes it unnecessary to further increase the resolution of the analog/digital converter 304.

Effects

As noted above, Embodiment 1 makes it possible to, by performing an analog equalization process with the analog equalizer 303, prevent deterioration in receiving characteristic without increasing the resolution of the analog/digital converter 304. This makes it easy to design a radio receiving apparatus for use in wideband radio communication.

Embodiment 2

Embodiment 2 of the present disclosure gives a description of a configuration in which a signal transmitted with the minimum unit of bandwidth BW1 and a signal transmitted with the channel-bonded bandwidth BW2 are received at different sampling rates of an analog/digital converter.

Configuration of Radio Receiving Apparatus

Figure 8:
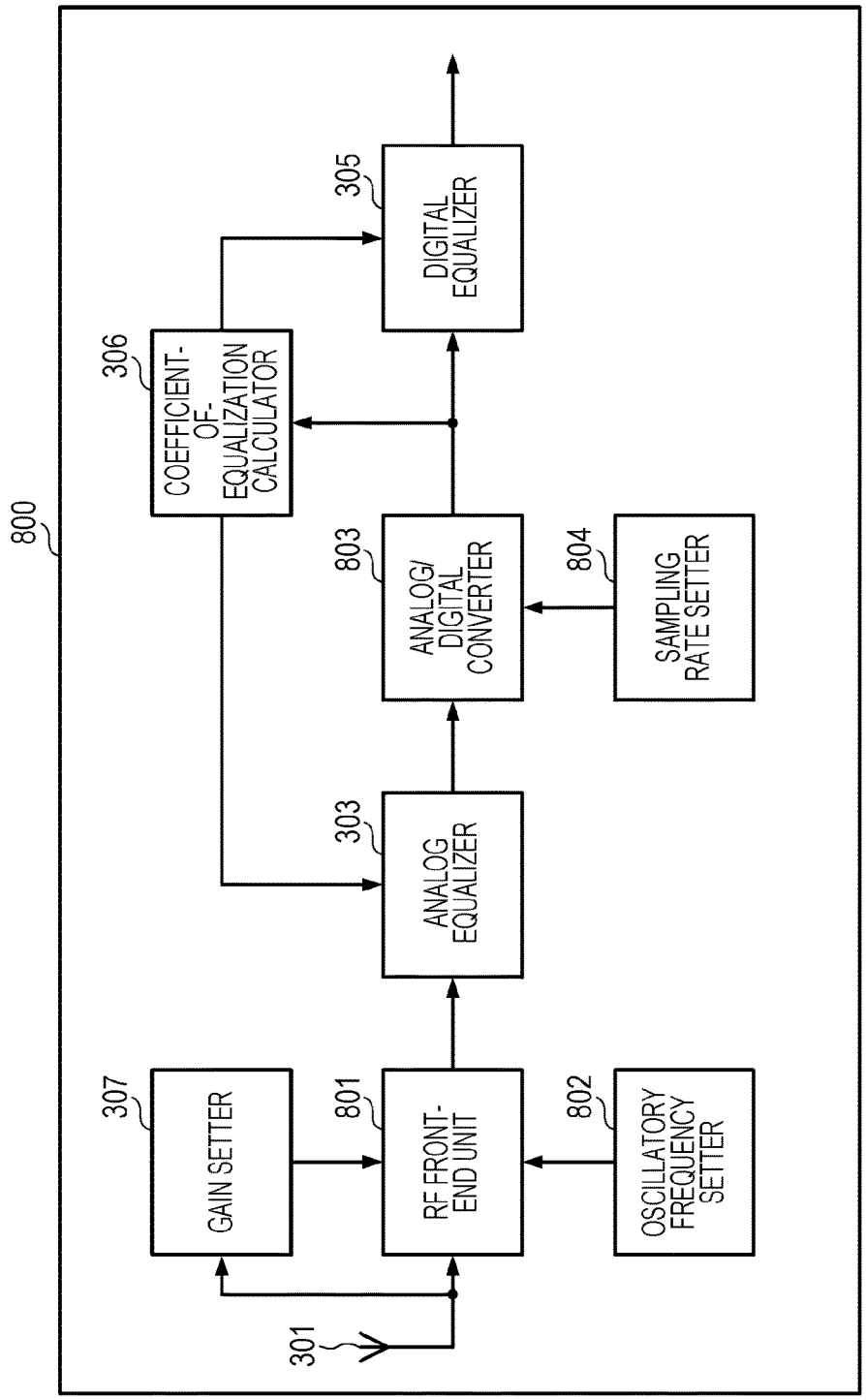
FIG. 8 is a diagram showing an example configuration of a radio receiving apparatus according to Embodiment 2.

FIG. 8 is a diagram showing an example configuration of a radio receiving apparatus 800 according to Embodiment 2. It should be noted that those component parts of the radio receiving apparatus 800 shown in FIG. 8 which are identical to those of the radio receiving apparatus 300 shown in FIG. 2 are given the same reference numerals and, as such, are not described below. The radio receiving apparatus 800 differs from the radio receiving apparatus 300 in that the radio receiving apparatus 800 is configured to further include an RF front-end unit (RF front-end circuitry) 801, an oscillatory frequency setter (oscillatory frequency setting circuitry) 802, an analog/digital converter (analog/digital conversion circuitry) 803, and a sampling rate setter (sampling rate setting circuitry) 804 with the omission of the RF front-end unit 302 and the analog/digital converter 304.

The RF front-end unit 801 amplifies, with use of a gain set by the gain setter 307, the amplitude of a radio-frequency received signal received via the receiving antenna 301. Furthermore, the RF front-end unit 801 performs, with use of a frequency set by the oscillatory frequency setter 802, downconversion on the received signal whose amplitude has been adjusted and outputs an analog baseband signal to the analog equalizer 303. It should be noted that an internal configuration of the RF front-end unit 801 will be described in detail later.

The oscillatory frequency setter 802 outputs a control voltage to the RF front-end unit 801 so that the RF front-end unit 801 uses different frequencies for the downconversion according to the fields of the received signal shown in FIG. 1.

The analog/digital converter 803 receives the analog baseband signal from the analog equalizer 303, samples and quantizes the analog baseband signal (i.e. converts the analog baseband signal into a digital signal) at a sampling rate set by the sampling rate setter 804, and outputs the digital baseband signal to the digital equalizer 305 and the coefficient-of-equalization calculator 306.

The sampling rate setter 804 outputs a control signal to the analog/digital converter 803 so that the analog/digital converter 803 uses different sampling rates for the sampling of the analog baseband signal according to the fields of the received signal shown in FIG. 1.

Internal Configuration of RF Front-end Unit

Figure 9:
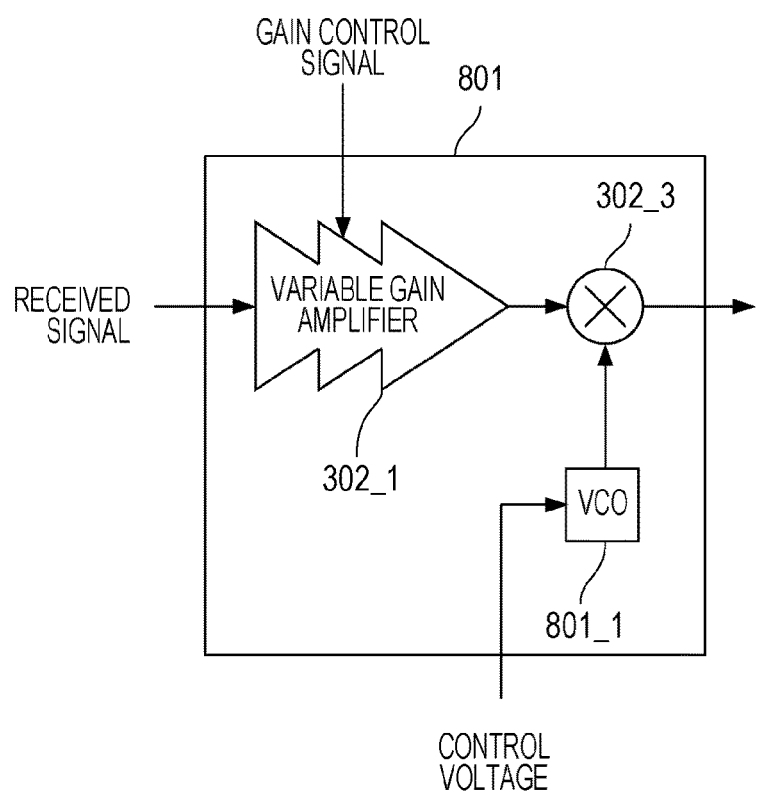
FIG. 9 is a diagram showing an example configuration of an RF front-end unit according to Embodiment 2.

Next, the internal configuration of the RF front-end unit 801 is described in detail with reference to FIG. 9. It should be noted that those component parts of the RF front-end unit 801 shown in FIG. 9 which are identical to those of the RF front-end unit 302 shown in FIG. 3 are given the same reference numerals and, as such, are not described below. The RF front-end unit 801 differs from the RF front-end unit 302 in that the RF front-end unit 801 is configured to further include a voltage-controlled oscillator (VCO) 801_1 with the omission of the local oscillator 302_2.

The voltage-controlled oscillator 801_1 is an oscillator that controls an oscillatory frequency at the control voltage that is inputted from the oscillatory frequency setter 802. A sine wave whose oscillation frequency has been controlled by the voltage-controlled oscillator 801_1 is outputted to the mixer 302_3.

Receiving Operation Sequence

Next, a receiving operation in the radio receiving apparatus 800 for receiving a received signal of the frame format 200 shown in FIG. 1 is described with reference to FIGS. 4, 8, and 9.

First, for reception of the first training field 201 transmitted through Channel 1, the oscillatory frequency setter 802 sets the control voltage at v1 (V) so that the oscillatory frequency of the voltage-controlled oscillator 801_1 becomes the center frequency f1 (Hz) (see FIG. 5) of Channel 1.

Further, the gain setter 307 calculates a gain g1 on the basis of the received power and peak-to-average power ratio of the first training field 201 received through Channel 1. The RF front-end unit 801 amplifies and downconverts the first training field 201, which was received via the receiving antenna 301, at the gain g1 and the frequency f1 (Hz), respectively, and outputs an analog baseband signal.

It should be noted that the analog equalizer 303 does not start an equalization process until the coefficient-of-equalization calculator 306 calculates the coefficient of analog equalization.

It should be noted that in a case of receiving the first training field 201 transmitted through Channel 2 instead of receiving the first training field 201 transmitted through Channel 1, the oscillatory frequency setter 802 may set the control voltage at v2 (V) so that the oscillatory frequency of the voltage-controlled oscillator 801_1 becomes the center frequency f2 (Hz) (see FIG. 5) of Channel 2, and the gain controller 307 may calculate a gain g2 on the basis of the received power and peak-to-average power ratio of the first training field 201 received through Channel 2.

It should be noted that in view of the difference between the received power of Channel 1 and the received power of Channel 2, the RF front-end unit 801 may receive a first-half portion of the first training field 201 transmitted through Channel 1 and receive a second-half portion of the first training field 201 transmitted through Channel 2.

For that purpose, the oscillatory frequency setter 802 may set the control voltage at v1 (V) in the first-half portion of the first training field 201 and set the control voltage at v2 (V) in the second-half portion of the first training field 201. In the first-half portion of the first training field 201, the gain setter 307 may calculate the gain g1 with use of the first training field 201 received through Channel 1, and in the second-half portion of the first training field 201, the gain setter 307 may calculate the gain g2 with use of the first training field 201 received through Channel 2.

Further, for the sampling of the first training field 201, the first channel estimation field 202, and the physical header 203, which were transmitted with the minimum unit of bandwidth BW1 (Hz), the sampling rate setter 804 sets the sampling rate of the analog/digital converter 803 at R1 (Hz). For example, R1=BW1.

Next, the analog/digital converter 803 samples and quantizes the analog baseband signal for the first training field 201, the first channel estimation field 202, and the physical header 203 and outputs a digital baseband signal.

Next, for the channel estimation of Channel 1 and the channel estimation of Channel 2, the oscillatory frequency setter 802 sets the control voltage at v1 (V) in a first-half portion of the first channel estimation field 202 and sets the control voltage at v2 (V) in a second-half portion of the first channel estimation field 202.

At this point in time, the gain setter 307 sets the gain of the gain control signal at g1 for the whole of the first channel estimation field 202, and the variable gain amplifier 302_1 amplifies the whole of the first channel estimation field 202 with use of the gain control signal of the gain g1.

Alternatively, the gain setter 307 may set the gain of the gain control signal at g2 for the whole of the first channel estimation field 202, and the variable gain amplifier 302_1 may amplify the whole of the first channel estimation field 202 with use of the gain control signal of the gain g2.

Alternatively, the gain setter 307 may set the gain of the gain control signal at g1 for the first-half portion of the first channel estimation field 202 and set the gain at g2 for the second-half portion, and the variable gain amplifier 302_1 may amplify the first-half portion of the first channel estimation field 202 with use of the gain control signal of the gain g1 and amplify the second-half portion with use of the gain control signal of the gain g2.

Next, as shown in FIG. 4, the first channel estimator 306_1 performs a channel estimation of Channel 1 with use of the first-half portion of the first channel estimation field 202 and outputs a first channel estimation result to the interpolation processor 306_3 and the coefficient-of-analog-equalization calculator 306_4. The second channel estimator 306_2 performs a channel estimation of Channel 2 with use of the second-half portion of the first channel estimation field 202 and outputs a second channel estimation result to the interpolation processor 306_3 and the coefficient-of-analog-equalization calculator 306_4. In this way, the coefficient-of-equalization calculator 306 calculates the coefficient of analog equalization by estimating the frequency characteristics of the RF front-end unit 302 with use of the first channel estimation field 202.

After the coefficient-of-equalization calculator 306 has calculated the coefficient of analog equalization, the analog equalizer 303 performs an analog equalization process on the physical header 203 and subsequent signals with use of the coefficient of analog equalization to correct the waveforms of the physical header 203 and subsequent signals, which were distorted by the frequency characteristics of the RF front-end unit 302.

After reception of the first channel estimation field 202, the gain setter 307 sets the gain of the gain control signal at g1, and the oscillatory frequency setter 802 sets the control voltage at v1 (V). Alternatively, the gain setter 307 may set the gain of the gain control signal at g2, and the oscillatory frequency setter 802 may set the control voltage at v2 (V). In this way, the radio receiving apparatus 800 receives the physical header 203 transmitted through Channel 1 or Channel 2.

For reception of the second training field 204, the second channel estimation field 205, and the payload 206 after reception of the physical header 203, the oscillatory frequency setter 802 sets the control voltage at v3 (V) so that the oscillatory frequency of the voltage-controlled oscillator 801_1 becomes the center frequency fc=(f1+f2)/2 (see FIG. 6) of Channel 3. Further, the gain setter 307 sets the gain of the gain control signal at g1, g2, or (g1+g2)/2.

Further, the sampling rate setter 804 sets the sampling rate of the analog/digital converter 803 at R2 (Hz), which is higher than R1 (Hz).

It should be noted that, for example, R2 may be set at twice as high a value as R1 since the second training field 204, the second channel estimation field 205, and the payload 206 have been transmitted with the bandwidth BW2 (Hz), which is twice as wide as the bandwidth BW1 (Hz) of the first training field 201, the first channel estimation field 202, and the physical header 203.

Further, since an analog equalization process lowers the error vector magnitude of a received signal (i.e. a signal finished with the analog equalization process), the analog/digital converter 803 may lower its resolution during reception of the physical header 203 and subsequent fields in a case where the payload 206 uses the same modulation scheme as that which the first training field 201, the first channel estimation field 202, and the physical header 203 use.

Next, the analog/digital converter 803 samples and quantizes the analog baseband signal for the second training field 204, the second channel estimation field 205, and the payload 206 and outputs a digital baseband signal.

The gain setter 307 calculates a gain g3 on the basis of the received power and peak-to-average power ratio of the second training field 204 received through Channel 3. The RF front-end unit 801 amplifies and downconverts the second training field 204, the second channel estimation field 205, and the payload 206, which were received via the receiving antenna 301, at the gain g3 and the frequency fc, respectively, and outputs an analog baseband signal.

Next, the third channel estimator 306_5 calculates the coefficient of digital equalization by estimating the residual frequency characteristics of the analog equalizer 303 with use of the second channel estimation field 205.

Finally, the digital equalizer 305 performs a digital equalization process with use of the coefficient of digital equalization calculated by the coefficient-of-equalization calculator 306, thereby correcting the waveform of the payload 206, which was distorted by the residual frequency characteristics.

Effects

As noted above, Embodiment 2 changes the sampling rate of the analog/digital converter 803 according to the bandwidths of the fields of a received signal so that (1) the sampling rate is lowered for a signal unprocessed with analog equalization (e.g. the signals representing the first training field 201 and the first channel estimation field 202 shown in FIG. 1) that requires high resolution in accordance with an increase in error vector magnitude by the frequency characteristics of the RF front-end unit 801 and (2) the sampling rate is raised for a signal whose frequency characteristics have been corrected by an analog equalization process and whose error vector magnitude has thus been reduced (e.g. the physical header 203 and subsequent signals shown in FIG. 1: a signal finished with the analog equalization process). This makes it possible to reduce the power consumption of the analog/digital converter 803.

Further, as for the signal finished with the analog equalization process, the resolution can be lowered in accordance with a decrease in error vector magnitude. This makes it easy to design the analog/digital converter 304, which has a trade-off between sampling rate and resolution, thus making it possible to raise the sampling rate.

Further, as for the first training field 201, the first channel estimation field 202, and the physical header 203, the signal is received through either Channel 1 or Channel 2. This makes the PAPR of the received signal lower than that of Embodiment 1, thus making it possible to lower the resolution of the analog/digital converter 803.

While embodiments have been described with reference to the drawings, the present disclosure is of course not limited to such examples. It is apparent that persons skilled in the art can conceive of various variations or modifications within the scope of the claims, and it is understood that such variations or modifications of course belong to the technical scope of the present disclosure.

Other Embodiments

Further, while each embodiment has been described above by taking, as an example, a case where an aspect of the present disclosure is configured by hardware, the present disclosure can also be realized by software in cooperation with hardware.

Further, each functional block used in the description of each embodiment described above can be typically realized by an LSI such as an integrated circuit. Further, the integrated circuit may control each functional block used in the description of each embodiment described above and include an input and an output coupled thereto. These LSIs may be individually formed as one chip, or one chip may be formed so as to include a part or all of the functional blocks. The LSI here may be referred to as an IC (integrated circuit), a system LSI, a super LSI, or an ultra LSI depending on a difference in the degree of integration.

However, the technique of implementing an integrated circuit is not limited to the LSI and may be realized by using a dedicated circuit or a general-purpose processor. In addition, an FPGA (Field Programmable Gate Array) that can be programmed after the manufacture of the LSI or a reconfigurable processor in which the connections and the settings of circuit cells disposed inside the LSI can be reconfigured may be used.

If future integrated circuit technology replaces LSIs as a result of the advancement of semiconductor technology or other derivative technology, the functional blocks could be integrated using the future integrated circuit technology. Biotechnology can also be applied.

Recapitulation of Embodiments

A radio receiving apparatus of the present disclosure includes: RF front-end circuitry that performs gain control and downconversion on a received signal; analog equalization circuitry that performs an analog equalization process on an output signal from the RF front-end circuitry in accordance with a coefficient of analog equalization; analog/digital conversion circuitry that samples and quantizes an output signal from the analog equalization circuitry; digital equalization circuitry that performs a digital equalization process on an output signal from the analog/digital conversion circuitry in accordance with a coefficient of digital equalization; and coefficient-of-equalization calculation circuitry that calculates the coefficient of analog equalization and the coefficient of digital equalization by estimating frequency characteristics with use of the output signal from the analog/digital conversion circuitry.

Further, the radio receiving apparatus of the present disclosure further includes gain setting circuitry that calculates a gain to fall the amplitude of an input signal to the analog/digital conversion circuitry within a full-scale range on the basis of the received power and peak-to-average power ratio of the received signal. In the radio receiving apparatus, the RF front-end circuitry performs gain control on the received signal on the basis of the gain calculated by the gain setting circuitry.

Further, in the radio receiving apparatus of the present disclosure, the analog equalization circuitry includes at least a resistor, an inductor, and a capacitor and sets at least one of the resistance of the resistor, the inductance of the inductor, and the capacitance of the capacitor in accordance with the coefficient of analog equalization.

Further, in the radio receiving apparatus of the present disclosure, a frame of the received signal contains a first training field, a first channel estimation field, a physical header, a second training field, a second channel estimation field, and a payload, the first training field, the first channel estimation field, and the physical header being transmitted through two or more narrowband channels with a minimum unit of bandwidth, the second training field, the second channel estimation field, and the payload being transmitted on a single wideband channel with a bandwidth wider than the minimum units of bandwidth, the wideband channel being set up by bundling the two or more narrowband channels, the coefficient-of-equalization calculation circuitry calculates the coefficient of analog equalization by performing a channel estimation of the narrowband channels with use of the first channel estimation field and calculates the coefficient of digital equalization by performing a channel estimation of the wideband channel with use of the second channel estimation field, the analog equalization circuitry performs an analog equalization process on the physical header, the second training field, the second channel estimation field, and the payload, and the digital equalization circuitry performs a digital equalization process on the payload.

Further, in the radio receiving apparatus of the present disclosure, the RF front-end circuitry performs downconversion with use of one or more types of local oscillatory frequency.

Further, in the radio receiving apparatus of the present disclosure, the analog/digital conversion circuitry uses different sampling frequencies for a signal finished with the analog equalization and a signal unprocessed with the analog equalization.

One general aspect of the present disclosure is suitable for use in a wideband communication radio receiving apparatus including an analog/digital converter having a sampling rate of several gigahertz to several tens of gigahertz.

What is claimed is:

1. A radio receiving apparatus comprising:
RF front-end circuitry, which, in operation, performs gain control and downconversion on a received signal,
  a frame of the received signal including a first training field, a first channel estimation field, a physical header, a second training field, a second channel estimation field, and a payload,
  the first training field, the first channel estimation field, and the physical header being transmitted through two or more narrowband channels with a minimum unit of bandwidth,
  the second training field, the second channel estimation field, and the payload being transmitted on a single wideband channel with a bandwidth wider than the minimum unit of bandwidth,
  the wideband channel being set up by bundling the two or more narrowband channels;
analog equalization circuitry that performs an analog equalization process on an output signal from the RF front-end circuitry in accordance with a coefficient of analog equalization, the analog equalization process being performed on the physical header, the second training field, the second channel estimation field, and the payload;
analog/digital conversion circuitry, which, in operation, samples and quantizes an output signal from the analog equalization circuitry;
digital equalization circuitry, which, in operation, performs a digital equalization process on an output signal from the analog/digital conversion circuitry in accordance with a coefficient of digital equalization; and
coefficient-of-equalization calculation circuitry, which, in operation, calculates the coefficient of analog equalization and the coefficient of digital equalization by estimating frequency characteristics with use of the output signal from the analog/digital conversion circuitry, the coefficient of analog equalization being calculated by performing a channel estimation of the narrowband channels with use of the first channel estimation field.

2. The radio receiving apparatus according to claim 1, comprising gain setting circuitry, which, in operation, calculates a gain to set the amplitude of an input signal to the analog/digital conversion circuitry within a full-scale range on the basis of a received power and a peak-to-average power ratio of the received signal,
  wherein the RF front-end circuitry performs the gain control on the received signal on the basis of the gain calculated by the gain setting circuitry.

3. The radio receiving apparatus according to claim 1, wherein the analog equalization circuitry includes at least a resistor, an inductor, and a capacitor, and sets at least one of a resistance of the resistor, an inductance of the inductor, and a capacitance of the capacitor in accordance with the coefficient of analog equalization.

4. The radio receiving apparatus according to claim 1, wherein
  the coefficient-of-equalization calculation circuitry calculates the coefficient of digital equalization by performing a channel estimation of the wideband channel with use of the second channel estimation field, and
  the digital equalization circuitry performs a digital equalization process on the payload.

5. The radio receiving apparatus according to claim 1, wherein the RF front-end circuitry performs the downconversion with use of one or more types of local oscillatory frequency.

6. The radio receiving apparatus according to claim 1, wherein the analog/digital conversion circuitry uses different sampling frequencies for a signal finished with the analog equalization process and a signal unprocessed with the analog equalization process.

* * * * *